United States Patent [19]

Rousseau

[11] 4,304,923
[45] Dec. 8, 1981

[54] PHOTOPOLYMERIZABLE OLIGOMER

[75] Inventor: Alan D. Rousseau, Stillwater, Minn.

[73] Assignee: Minnesota Mining and Manufacturing Company, St. Paul, Minn.

[21] Appl. No.: 109,191

[22] Filed: Jan. 2, 1980

Related U.S. Application Data

[60] Division of Ser. No. 15,586, Feb. 27, 1979, Pat. No. 4,228,232, which is a continuation-in-part of Ser. No. 901,480, May 1, 1978, abandoned.

[51] Int. Cl.$^3$ .......................................... C07C 125/073
[52] U.S. Cl. ..................................... 560/26; 556/420; 556/414; 560/158; 560/164; 560/166; 560/115; 560/33
[58] Field of Search ................. 560/26, 158, 164, 166, 560/115; 556/420, 414

[56] References Cited

U.S. PATENT DOCUMENTS

| | | | |
|---|---|---|---|
| 3,840,369 | 10/1974 | Carlick et al. | 430/285 |
| 4,057,431 | 11/1977 | Finelli et al. | 528/48 |
| 4,065,627 | 12/1977 | Harrison | 528/75 |
| 4,078,015 | 3/1978 | Leitheiser et al. | 560/26 |
| 4,153,778 | 5/1979 | Park et al. | 528/76 |

*Primary Examiner*—G. T. Breitenstein
*Attorney, Agent, or Firm*—Cruzan Alexander; Donald M. Sell; Mark A. Litman

[57] ABSTRACT

Ethylenically unsaturated polymerizable oligomers, which are particularly useful in printing plate compositions, comprise backbones formed by the removal of hydrogen from hydroxyl groups and having bonded thereto both carboxylic acid groups and ethylenically unsaturated, free radical polymerizable groups, these last two groups bonded to the backbone through the reaction of isocyanate groups.

7 Claims, No Drawings

PHOTOPOLYMERIZABLE OLIGOMER

This is a division of application Ser. No. 15,586 filed Feb. 27, 1979, now U.S. Pat. No. 4,228,232, which in turn is a continuation-in-part of application Ser. No. 901,480, filed May 1, 1978, now abandoned.

FIELD OF THE INVENTION

This invention relates to novel photopolymerizable compositions, photoimagable recording elements, and a process for imaging with photopolymerizable compositions.

PRIOR ART

Photopolymerizable compositions have been used in photosensitive elements, such as printing plates, for a number of years. Such compositions have been satisfactory only where contact printing of the plate and relatively long time exposures can be tolerated. Most representative of the prior art are compositions disclosed in U.S. Pat. Nos. 3,218,167 and 3,887,450. In U.S. Pat. No. 3,218,167, photosensitive compositions comprising (1) an ethylenically unsaturated compound (e.g., pentaerythritol polyacrylate), (2) a sensitizing dye, and (3) a thermoplastic binder (e.g., cellulose ether or polyvinyl ether). In U.S. Pat. No. 3,887,450 a radiation sensitive composition is described which comprises (1) an acrylic monomer (e.g., pentaerythritol triacrylate), (2) a photosensitive dye, and (3) a binder comprising a copolymer of styrene and a carboxyl containing comonomer (e.g., acrylic or maleic acid). This latter composition has the advantage of being developable (i.e. soluble in non-irradiated areas) by basic developers. The composition is relatively slow, however, and must be exposed in the absence of oxygen.

Radiation sensitive elements which are oxygen insensitive have been produced by overcoating the elements with an oxygen barrier layer as in U.S. Pat. No. 3,895,949. Here a support bearing a photopolymerizable composition comprising a glycidyl acrylate adduct of a styrene/maleic anhydride adduct, an ethylenically unsaturated monomer (e.g., pentaerythritol tetraacrylate), and a photoinitiator is overcoated with an oxygen/moisture barrier layer (e.g., a copolymer of an acrylic acid and copolymerizable ethylenically unsaturated compound). Such elements are relatively oxygen insensitive (by reason of the barrier layer), and with proper selection of the barrier layer can be developed with basic solutions after exposure. These elements remain relatively slow and require the additional coating operation to provide the barrier layer. In addition to the time and cost factors resulting from the overcoating operation, careful control of solvents and conditions in this step must be observed to avoid sensitometric damage to the photosensitive layers.

Other radiation sensitive compositions known in the art include those of U.S. Pat. No. 3,827,956. This ultraviolet radiation sensitive composition comprises (1) an acrylic monomer (e.g., pentaerythritol triacrylate), (2) an acrylate oligomer (e.g., the reaction product of toluene diisocyanate with two equivalents of 2-hydroxyethyl methacrylate), and (3) a halogenated polynuclear lactone catalyst. U.S. Pat. Nos. 3,297,745; 4,017,649; and 4,065,627 describe other acrylate end-capped urethane oligomers which can be homopolymerized or copolymerized with other ethylenically unsaturated compounds. These materials are photopolymerizable with relatively high radiation sensitivity and low oxygen sensitivity, but they are not base soluble and have no base developable printing plate capability because of this. These compositions also have poor bonding characteristics to metal surfaces such as zinc and aluminum.

SUMMARY OF THE INVENTION

It has been found that high speed radiation sensitive photopolymerizable compositions with excellent adhesion to certain substrates, especially aluminum surfaces, which compositions are suitable for use in radiation sensitive printing plates and color proofing sheets can be made. These compositions also can have extensive shelf stability and oxygen insensitivity, and the polymers produced therefrom are tough and have a long service life. The compositions are also base soluble and can be developed in basic solutions in printing plate processes.

The photosensitive compositions of the present invention comprise (1) an ethylenically unsaturated free radical polymerizable end-capped oligomer, the bridging oligomeric portion between the unsaturated capping groups having carboxyl group substitution thereon, (2) a polymeric binder, (3) at least one free radical polymerizable monomer having at least one ethylenically unsaturated group, and (4) a radiation sensitive initiator system capable of initiating free radical polymerization upon absorption of electromagnetic radiation.

A storage stable photosensitive imaging element of particular use in providing base developable printing plates can be made by applying the photosensitive compositions of the present invention to a support layer.

Particularly improved compositions comprising the photosensitive oligomers, limited classes of binder, polymerizable monomers, and photoinitiation systems have unexpectedly high radiation sensitivity and no oxygen or moisture sensitivity.

DETAILS OF THE INVENTION

There are basically four essential ingredients of the radiation sensitive compositions of the present invention, (1) an oligomer, (2) a binder, (3) a polymerizable monomer, and (4) a photoinitiation system. All four of these materials must be present in the polymerizable composition for it to work well in photoimagable recording elements as in lithographic printing processes. Generally, the compositions comprise per 100 parts total:

10 to 60 parts by weight of oligomer,
10 to 60 parts by weight of binder,
10 to 60 parts by weight of monomer, and
0.1 to 12.0 parts by weight of photoinitiator system.

It is preferred to have as the photoinitiator system a photosensitizer and a compound which when photosensitized is capable of initiating free radical polymerization. In the practice of this invention the second compound is defined as an initiator. The photoinitiator system is more preferably present in an amount of 0.5 to 10 parts. Preferably, the photosensitive composition comprises per 100 parts total:

15 to 45 parts by weight of oligomer,
15 to 35 parts by weight of binder,
25 to 50 parts by weight of monomer,
0.2 to 10 parts by weight of initiator (more preferably 2 to 8), and
0.1 to 5 parts by weight of photosensitizer (more preferably 1 to 4).

Most preferably the compositions of the present invention comprise per 100 parts total, by weight:
  20 to 35 parts oligomer,
  20 to 30 parts binder,
  30 to 50 parts monomer,
  2 to 6 parts initiator, and
  1 to 3 parts photosensitizer.

Generally, the photosensitive compositions of the invention are prepared by mixing the components in a low boiling (at atmospheric pressure boiling at less than about 150° C.) polar solvent that is not reactive with carboxyl groups or ethylenically unsaturated groups, such as methanol, ethanol, propanol, acetone, methylethyl ketone, tetrahydrofurane or mixtures thereof. There may even be water present although less than 50% by weight of water in the solvent is preferred. The amount of solvent used (generally 0 to 98% by weight, preferably 10 to 96% by weight and in lithographic applications 85 to 95% by weight solvent is most preferred) depends upon the desired viscosity and desired coating thickness. It is often desirable to add a surfactant or coating aid, but these aids, including the solvent are not functionally required for practice of the invention, but are merely better modes of practice. 0.001 to 2% of surfactant, particularly silicone or fluorocarbon surfactants will usually be sufficient.

These compositions may contain any number of additional useful additives such as dyes, pigments, coating aids, surfactants, etc.

The coating weight of the compositions of the present invention is usually 0.3 to 9 g/m², preferably 0.5 to 5 g/m², and most preferably 0.8 to 2.4 g/m². Suitable substrates include resin coated paper, various transparent or opaque plastic sheet or film, metal sheets and foils (preferably aluminum substrates that have been grained and anodized. The coated substrates must be maintained in the absence of light unless the element is sensitized to a narrow range of the electromagnetic spectrum outside the range of normal light and the element is provided with a filter layer which excludes normal visible light.

The preferred utility of the photopolymerizable compositions of the present invention is as a presensitized plate for use in printing operations such as in the formation of lithographic plates. This structure comprises a grained and anodized aluminum substrate coated with from 0.3 to 9 g/m² of the compositions of the present invention. Grained substrates are surfaces which have been textured or roughened. This treatment is well known in the art and can be effected by brush graining (roughening with an abrasive material), chemical etching, or electrochemical graining. Anodizing is the well known anodic oxidation of metal surfaces. Polymer top coat layers used in these constructions must be dissolvable in aqueous alkaline solutions of pH 8–13 such as the aqueous developers of the examples.

A generic structural formula for the urethane oligomers can be drawn as follows:

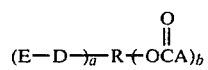

wherein
  E is an ethylenically unsaturated, free radical polymerizable group, preferably selected from acryloyloxyalkoxy (alternatively named acryloxyalkoxy), methacryloylalkoxy (alternatively named methacryloxyalkoxy), vinylalkoxy, and allyloxy,
  D is the residue of a polyisocyanate (preferably a diisocyanate) having at least two of its —N=C=O groups reacted to form

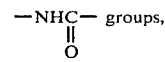

D bonding E to R,
  A is a carboxylic acid containing group, (e.g.,

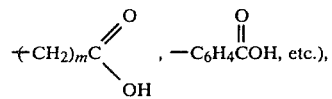

a is a number having an average value between 2 and 20,
  b is a number having an average value between 0.3 and 10, and
  m = 1 to 6,
  R is the residue of a polyol having at least a+b hydroxyl grops and a number average molecular weight between 90 and 10,000, the residue formed by removal of hydrogen from the hydroxyl groups.

The backbone of the oligomer, group R, may be any aromatic or aliphatic polyol having a molecular weight between 90 and 10,000. The backbone of the oligomer may be any oligomer with the requisite molecular weight and number of hydroxyl groups, but polyesterpolyols and polyoxyalkylene polyols are preferred. Linear oligomeric polyols are useful but the branched or three-dimensional polyols such as polycaprolactone polyols are preferred. The backbone may be prepared by any of the many well known methods of forming polyhydroxyl substituted oligomers having a molecular weight between 90 and 10,000. The polyols must have a hydroxy equivalent weight of between 45 and 5,000 to be useful according to the present invention. Preferably the polyol has a hydroxy equivalent weight between 90 and 4,000 and most preferably between 200 and 2,000.

The oligomers backbone may be homopolymeric, copolymeric, graft polymeric, or mixtures thereof. For example, polycaprolactone polyols may be used, or lower molecular weight polycaprolactone polyols (average molecular weights of less than, for example, 500) may be joined by polyacids (preferably dicarboxylic acids) or by polyisocyanates (preferably diisocyanates) to form higher molecular weight oligomer backbones.

In the synthesis of the oligomers useful in the present invention, it is preferred to join the E-D substituent to the oligomeric backbone R by first separately forming an adduct of the polyisocyanate of which D is a residue by reacting one mole of the diisocyanate with one mole of an ethylenically unsaturated free radical polymericable monomer having one hydroxyl group. The adduct formed is then reacted with a hydroxyl group on the oligomer polyol backbone (the reaction being with an isocyanate group). In an alternative method where the compound with the free radical polymerizable group with one hydroxyl group and the polyisocyanate are added to the oligomeric polyhydroxy backbone before forming the E-D adduct, the polyisocyanate will act both as a polymer extender for the oligomer and as an adduct former with the free radical containing compound. In such a reaction there would be far less control over the final product and there would be a tendency for the oligomer to gel. Therefore the free radical polymerizable monomer and the polyisocyanate (preferably diisocyanate) in an independently run synthesis form, for example, an isocyanatoalkylacrylate, isocyanatoalkylmethacrylate, an isocyanato alkyl ether, or isocyanatoalkylvinyl ether adduct.

The adduct (E-D) formed in that step is then caused to react with the polyhydroxy containing backbone so that the remaining isocyanate group of the adduct reacts with some, but not all, of the hydroxyl groups on the oligomer to bond thereto.

The carboxylic acid groups are added to the oligomeric backbone preferably after addition of the free radical polymerizable moieties by reaction of remaining hydroxyl groups on the oligomeric backbone with a compound having free carboxyl groups. Preferably such a compound is a dicarboxylic acid or anhydride so that the linking bond to the oligomeric backbone is an ester group. An isocyanate linkage can be formed by first making an acid-isocyanate adduct.

A more specific formula representing preferred oligomeric materials is as follows:

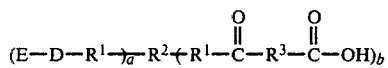

wherein
D, a, and b are as defined above,
E is selected from

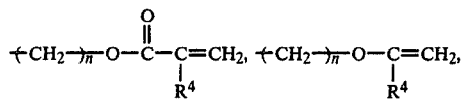

and $-(CH_2)_nO-CH_2-CH=CH_2$, where $R^4$ is $-H$ or $-CH_3$, and n is an integer of from 2 to 4 inclusive,
$R^1$ is the residue formed by the removal of active hydrogen atoms and hydroxyl groups from oligomeric Ω-hydroxy carboxylic acids or the residue formed by the removal of active hydrogen atoms and hydroxyl groups from oligomeric diols,
$R^2$ is a residue, having a valence of a plus b, of an aliphatic polyol having the formula $R^5(OH)_{a+b}$ after removal of a+b hydrogens from hydroxyl groups, or a polyol having the formula

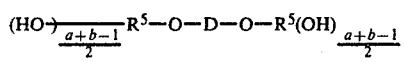

after removal of a+b−1 hydrogens from hydroxyl groups wherein $R^5$ is the residue of an aliphatic polyol radical formed by having the OH groups removed therefrom and having 3 to 10 valences substituted with OH groups and which can have one or two ether oxygen atoms in the aliphatic backbone, and
$R^3$ is the residue of a dicarboxylic acid having both

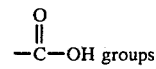

removed therefrom.

Preferably the molecular weight of $(R^1)_aR^2(R^1)_b$ is between 200 and 5,000.

Particularly desirable aliphatic polyols from which $R^2$ is formed are polyether polyols, polyester polyols, polylactone polyols, polyolefin polyols, polydiene polyols, polysiloxane polyols, poly(alkylacrylate) polyols, and poly(glycidyl ether) polyols.

A particularly desirable material is represented by the structural formula

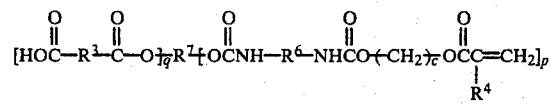

wherein
$R^3$ and $R^4$ are as defined above,
c is 2 to 5 inclusive,
p is a number average value of 2 to 7.7,
q is a number average value of 0.3 to 4,
$R^6$ is the residue of a diisocyanate having two $-N=C=O$ groups removed therefrom and preferably is an aromatic residue thereof, and
$R^7$ is an organic triyl radical which is the residue of an organic polyol with at least three hydroxyl groups removed therefrom and having a molecular weight of from 90 to 10,000, preferably selected from aliphatic triols, tetrols and pentols, poly(oxyalkylene)triols, tetrols and pentols, polyestertriols, tetrols and pentols, polylactonetriols, tetrols and pentols, polyolefintriols, tetrols and pentols, polyacrylatetriols, tetrols and pentols, polyalkylacrylatetriols, tetrols and pentols, and polysiloxanetriols, tetrols and pentols.

Another particularly desirable material can be represented by

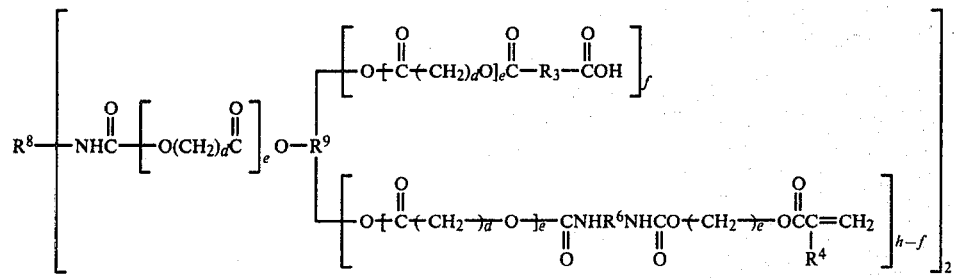

wherein
$R^3$ and $R^6$ are as defined above,
d is 1 to 6 inclusive,
e is an average value of 0.5 to 5 inclusive,
f is an average value of 1 to 6 inclusive,
$R^8$ is the divalent hydrocarbon radical which is the residue of an organic polyisocyanate (preferably diisocyanate) with two isocyanate groups removed therefrom, $R^9$ is an alkanepolyyl radical having a valence of h+1 that is the residue of an alkanepolyol having h+1 hydroxyl groups removed therefrom (preferably having h+1 hydroxyl groups before removal), said alkanepolyol having a molecular weight of from 100 to 10,000 and preferably 200 to 2,000, wherein h is an integer of from 2 to 8.

The general method of preparing the oligomers of the present invention is as follows.

STEP ONE—Preparation of a one-to-one adduct of a hydroxyalkyl (free radical polymerizable) material and a polyisocyanate, preferably a diisocyanate. This is done by reacting the two materials in a one-to-one ratio.

STEP TWO—Reaction of an organic polyol having X number of hydroxyl groups with up to X−1 moles of the adduct of STEP ONE. This forms a urethane oligomer having both ethylenically unsubstituted groups and at least one free hydroxyl group. Although, of course, in this reaction some individual oligomeric moieties may have all X hydroxyl groups reacted with the isocyanate, by control of the proportions of isocyanate adduct and polyol, the number average of free hydroxyl groups on the urethane oligomer will be at least one.

STEP THREE—The free hydroxyl groups on the product of STEP TWO are esterified with a polycarboxylic acid (preferably a dicarboxylic acid and most preferably an anhydride of a diacid). This reaction forms the carboxyl-substituted, ethylenically unsaturated urethane oligomer of the invention.

The adduct of the hydroxyalkylacrylate and the diisocyanate of STEP ONE has the general formula:

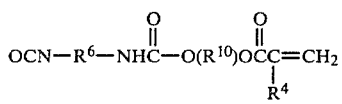

wherein $R^6$, $R^4$ and a are as defined above, and $R^6$ is preferably tolyl, and $R^{10}$ is an aliphatic group and preferably is $(CH_2)_{2-6}$.

It is preferred to use diisocyanates such as tolylene-2,4-diisocyanate and isophorone diisocyanate because of the great differential between reactivities of the isocyanate groups thereon. Without this differential, the product would have to be purified or else there would be less control over the subsequent product.

Such adducts are prepared by the addition of about 0.9 to 1.1 molar equivalent of the hydroxyalkylacrylate to one mole of organic diisocyanate while stirring the reaction mixture. Generally, it is desirable to hold the temperature below about 30° C. during the addition. The reaction can be complete after stirring the mixture for 10 minutes to an hour or more. If not completed that quickly, the reaction may be completed by further heating the mixture at temperatures of 50° or more for at least an hour. Since many of the reaction products are viscous liquids or solids (the reaction product of 2-hydroxyethyl methacrylate and 2,4-toluene-diisocyanate is a solid) it is preferable to add 0.25 to about 35 parts by weight of a non-functional group containing solvent, such as methylethyl ketone, acetone, tetrahydrofurane or the like. The solvent can be added at the beginning of the reaction, or along with the addition of the hydroxyalkylacrylate. Although not always necessary, it is often desirable to add a catalyst to effect the reaction between the hydroxyl group of the hydroxyalkylacrylate and one of the isocyanate groups of the organic diisocyanate. Suitable catalysts for the reaction are well known; an example of which is dibutyltin dilaurate.

STEP TWO is accomplished by adding over a period of one to five or more hours either the product of STEP ONE to an organic polyol as defined above while heating the mixture at about 50° to 100° or vice-versa. As for STEP ONE, a catalyst such as dibutyltin dilaurate can be used to facilitate the reaction. It is often desirable to add a polymerization inhibitor such as 2,6-di(t-butyl)-4-methylphenol to prevent premature polymerization. The ratio of diisocyanate-hydroxyalkylacrylate adduct to organic polyol is chosen so that one mole of oligomer obtained by the reaction contains at least two acrylic groups but leaves at least 0.3 equivalents unreacted hydroxyl groups.

STEP THREE is carried out, generally without isolating the product of STEP TWO, by esterification of unreacted hydroxyls in the product of STEP TWO with an anhydride of a dicarboxylic acid. Preferably, the esterification is accomplished by adding an amount of an anhydride of a dicarboxylic acid such as preferably succinic acid anhydride or adipic acid anhydride and continuing heating 50° to 100° C. for 3 to about 10 hours, the higher the temperature, the shorter the heating time required. Depending on the extent of carboxylation desired, there is used from about 0.3 to about 4 moles of anhydride per mole of organic polyol originally present in the reaction mixture. The esterification, however, can be preformed using in place of the anhydride an ester of the dicarboxylic acid, viz., the methyl or ethyl ester and by ester interchange distill of the corresponding methanol or ethanol formed. Esterification can also be preformed using other reactive derivatives of the dicarboxylic acid such as the diacid chloride and removing the hydrogen chloride formed. Sometimes it is necessary to add a basic catalyst, such as lithium acetate, to increase the rate of this reaction.

Controlling the ratio of the number of acid (carboxylic acid) groups on the oligomer to the gram molecular weight of t-e oligomer is an effective way of controlling the bondability of the composition to a substrate after photoinitiated reaction. With increasing acid concentration, the composition is removed more easily in development. A wide range of ratios can be used, depending upon the performance characteristics desired in the final product. A composition having a ratio of molecular weight to acid groups between 67 and 17,000 is useful. It is preferred to have the ratio of molecular weight to acid groups in the oligomer between 500 and 5,000, and most preferably between 800 and 3,000.

Binders

The second of the critical elements in the photopolymerizable compositions of the present invention is the binder. This material is an organic film forming polymer having a molecular weight of at least 6,000, preferably 12,000 and most preferably at least 15,000. It is desirable, but not essential for practice of the present invention, for the binder to have a labile hydrogen or easily abstractable hydrogen thereon. The polymer preferably has a molecular weight of no greater than 100,000, preferably no greater than 80,000 and most preferably no greater than 50,000, although binders with molecular weights up to 2,000,000 or 3,000,000 are known in the art. To be a labile or easily abstractable hydrogen, a hydrogen in the binder must be attached to a carbon atom having an adjacent heteroatom selected from N, S, Se, and O. Preferably the heteroatom is N, S, or O. It is also preferred that the carbon having the easily abstractable hydrogen thereon is in a 5, 6, or 7-membered heterocyclic ring comprised of C, N, S, and O atoms, with preferably two heteroatoms adjacent to the carbon atom having the labile hydrogen. The carbon atom bearing the labile hydrogen can be primary, but is preferably secondary or tertiary. The greater the ease of abstractability the lower the proportion of binder that the composition needs, although not necessarily in a linear relationship. Preferred binders are the polyvinyl acetals such as polyvinyl formal, polyvinyl butyral, and mixtures thereof. Poly(vinyl methylether, polyvinyl alcohol, hydroxyalkylcellulose (e.g., hydroxypropylcellulose), polyamides, polyvinylacetate, polyvinylacetate-polyvinylchloride copolymers, polyethyleneoxides, and polyacrylates (e.g., polyalkylmethacrylates have also been found to work well).

The rate or quantum efficiency of double bond conversion (i.e., polymerization) and the photosensitivity of various coatings exposed in air are a function of the type of polymeric binder used. While some polymers give no increase in rate and photosensitivity to the composition, many polymers have been found that give surprisingly large increases. Amongst the polymers that have been shown to give an increase in the rate of conversion of double bonds include polyvinylacetals, polyvinylalcohol, hydroxyalkylcellulose (e.g., hydroxypropylcellulose), polyamides, polyvinylacetate, polyvinylacetatevinylchloride, polyethyleneoxide, and polyalkylmethacrylates. Polymers that do not give an increase include certain aliphatic hydrocarbon resins, cellulose acetatebutyrate, certain polyurethanes such as Estane ®, and linear saturated polyesters.

It should be understood by those knowledgeable in the art that not all polymers that give a rate increase are necessarily the best binders for lithographic plate coatings although they are still useful and desirable in other imaging processes such as duplicating film and proofing systems. Other properties such as solubility, water sensitivity and adhesion must be considered in choosing a polymeric binder for lithograhic plates.

The exact function of the binder in the compositions of the present invention is not understood. The labile hydrogen thereon is believed to be desirable, as many materials without a labile hydrogen do not appear to work as well as those with labile hydrogens, although some do in fact work well. Oxygen barrier characteristics may be additionally desirable in the binder polymer but such characteristics are not known to be essential.

Monomers

Another of the critical materials in the photopolymerizable compositions of the present invention is the monomer. This material is a free radical polymerizable monomer having one or more ethylenically unsaturated groups, and preferably 2 to 4 ethylenically unsaturated groups such as acrylate, methacrylate, vinyl and allyl. Preferred are compounds having multiple acrylate and methacrylate groups, e.g., acrylic esters of low molecular weight polyols, such as trimethylolpropanetriacrylate, pentaerythritol tetraacrylate and triacrylate, etc. Preferably these monomers have a molecular weight of less than 2,000 and more preferably less than 1,000.

Suitable free radical polymerizable monomers useful in the compositions of the invention are well known and listed in many patents, e.g., U.S. Pat. Nos. 3,895,949 and 4,037,021. Preferred monomers are the polyacrylate and polymethacrylate esters of alkanepolyols, e.g., pentaerythritol tetraacrylate, tris(2-acryloxyethyl)isocyanurate, tris(2-methyacryloxyethyl)isocyanurate, 2-acetoxyethyl methacrylate, tetrahydrofurfurylmethacrylate, 1-aza-5-acryloxymethyl-3,7-dioxabicyclo [3.0.0] octane (ADOZ) bis[4-(2-acryloxyethyl)phenyl]dimethyl methane, diacetone acrylamide, and acrylamidoethyl methacrylate.

Initiator

The compositions of the present invention must also have a radiation sensitive system capable of initiating free radical polymerization upon absorption of radiation. Free radical initiators are materials known in the art, such as *Free-Radical Chemistry*, D. C. Nonhebel and J. C. Walton, University Press (1974). Particularly suitable free radical generators can be selected from many classes of organic compounds including, for example, organic peroxides, azo compounds, aromatic diazonium salts, aromatic iodonium salts, aromatic sulfonium salts, aromatic phosphonium salts, quinones, benzophenones, nitroso compounds, acyl halides, aryl halides, hydrazones, mercapto compounds, pyrylium compounds, triarylimidazoles, biimidazoles, chloroalkyltriazines, etc. These materials, in generaly, must have photosensitizers therewith to form a photoinitiator system. Photosensitizers are well known in the art.

Additional reference in the art to free radical photoinitiator systems for ethylenically unsaturated compounds are included in U.S. Pat. No. 3,887,450 (e.g., column 4), U.S. Pat. No. 3,895,949 (e.g., column 7), and U.S. Pat. No. 4,043,819. Preferred initiators are the onium salts as disclosed in U.S. Pat. Nos. 3,729,313; 4,058,400; and 4,058,401. Other desirable initiators are biimidazoles (disclosed in U.S. patent application Ser. No. 824,733, filed Aug. 15, 1977) and chloroalkyltriazines as disclosed in U.S. Pat. No. 3,775,113. These references also disclose sensitizers therein. Another good reference to photoinitiator systems is *Light-Sensitive Systems*, J. Kosar, 1965, J. Wiley and Sons, Inc., especially Chapter 5.

PREPARATION I

A polycaprolactone hexol is prepared for use in forming a carboxyl substituted urethane oligomer.

63.5 grams dipentaerythritol, 228 grams epsilon-caprolactone, and 0.02 grams 2,6-di-t-butyl-4-methyl phenol (as an oxidation inhibitor) were added to a 500 ml, three-neck flask which had been fitted with an overhead mechanical stirrer and a condenser. The liquid was deoxygenated for 20 minutes by bubbling with dry nitrogen from a gas dispersion tube. This tube was then replaced with a gas inlet adapter and the reaction mixture was heated while maintaining a slight positive pressure with nitrogen. The mixture was maintained at 170° C. for 5 hours under continual stirring. The reaction mixture was then allowed to cool to room temperature under a nitrogen atmosphere. This material is referred to as P-I. This procedure is similar to that in U.S. Pat. No. 3,169,945.

PREPARATION II

A urethane oligomer (hereinafter P-II) was prepared according to the following procedures.

A 1000 ml three-neck flash was fitted with an adapter, mechanical stirrer, thermometer, addition funnel, and drying tube. To this flask was charged 175 grams of polycaprolactone hexol P-I and 60 ml of methylethyl ketone. A solution of 13 grams of 2,4-tolylene diisocyanate in 9 ml of methylethyl ketone was slowly dripped into the first solution with stirring at room temperature. The addition was completed in 20 minutes and the reaction mixture stirred for 90 minutes at 30° C., after which time infrared spectroscopy showed that essentially all the isocyanate had reacted.

To a second flask fitted with an overhead mechanical stirrer, thermometer, addition funnel, and drying tube was charged 86.1 grams of 2,4-tolylene diisocyanate. To the addition funnel was added 70.2 grams 2-hydroxyethylmethacrylate (hereafter HEMA) and 0.02 grams of the inhibitor of the previous preparation, which was then slowly added with stirring to the diisocyanate while maintained below or at 30° C. The addition was completed in 15 minutes and after 40 minutes of reaction time, a white solid formed. The solid was dissolved in 45 ml of methylethyl ketone by heating to 45° C. and held at that temperature for 10 minutes to complete the reaction.

The flask containing the reaction product (adduct) of the polycaprolactone hexol (P-I) and the 2,4-tolylene diisocyanate was heated to 67° C. and the solution of the HEMA/2,4-tolylene diisocyanate adduct in methylethyl ketone was added slowly with stirring over a period of 2 hours. 27 grams of succinic anhydride was then added with an additional 0.02 grams of the inhibitor. Heating and stirring was continued until the anhydride had completely reacted (about 5-6 hours).

The final product is a carboxyl substituted urethane oligomer, P-II.

PREPARATION III

The preparation of a second carboxyl substituted urethane oligomer is here described.

To a 500 ml three-neck flask was charged 29.2 grams of a poly(propylene oxide)triol having a molecular weight of 740, 25 ml ethyl acetate, and 0.007 grams of methylhydroquinone as a reaction inhibitor. The flask was heated in a 65° C. oil bath with stirring and 13.0 grams HEMA and 17.4 grams tolylene diisocyanate were added simultaneously from addition funnels. After addition of one half of these reactants, the reaction mixture was stirred for another 30 minutes. Then 0.001 grams SnCl2 catalyst and 0.004 grams 3,4-epoxycyclohexylmethyl-3,4-epoxycyclohexane carboxylate were added. The reaction mixture was stirred another 30 minutes and then the remainder of the HEMA and diisocyanate were added slowly. Stirring was continued overnight. Infrared analysis showed no free isocyanate groups after that time. To this reaction mixture was added, with stirring, 1.4 grams succinic anhydride. The temperature was raised to 93° C. and held there until the anhydride was completely reacted. The mixture was then cooled and diluted to 50% weight solution of P-III oligomer in ethyl acetate.

PREPARATION IV

A 250 ml flask was charged with 21.2 grams of a polycaprolactone polyol having a molecular weight of about 540, 25.1 ml of ethyl acetate and 0.007 grams methylhydroquinone as an antioxidant. 17.4 grams of tolylene-2,4-diisocyanate and 13.0 grams of 2-hydroxyethylmethacrylate (HEMA) were individually added to addition funnels on the flask. The polyol solution was heated to 67° C. and the diisocyanate and HEMA were added dropwise with rapid stirring until half of each material was added. At this point stirring and heating were continued for 30 minutes. 0.002 grams SnCl2 and 0.008 grams of 3,4-epoxycyclohexylmethyl-3,4-epoxycyclohexane carboxylate were added and the solution stirred for another 30 minutes. The remainder of the diisocyanate and HEMA was added dropwise and then an additional 5 ml of ethyl acetate was added. The mixture was stirred at 67° C. overnight. When isocyanate was no longer detectable by infrared analysis, 1.4 grams of succinic anhydride was added along with 10 ml of ethyl acetate. The temperature was raised to 100° C. and the reaction of the anhydride was indicated by infrared analysis as essentially complete after five hours.

This resulting material, a carboxylic substituted urethane oligomer, is referred to as P-IV and is useful in the practice of the present invention.

PREPARATION V

A particularly useful binder material for the oligomers was prepared as follows. A low molecular weight polyvinyl alcohol (88% hydrolyzed polyvinylacetate) was reacted with butyraldehyde and acrolein using an acid catalyst, preferably sulfuric acid. The proportion of reactants was 100/43.2/6.4 respectively. The product was precipitated from water with a dilute weak basic solution (NaHCO3). Analysis of the product showed the empirical formula to be close to that based on the stoichiometry of the reaction,

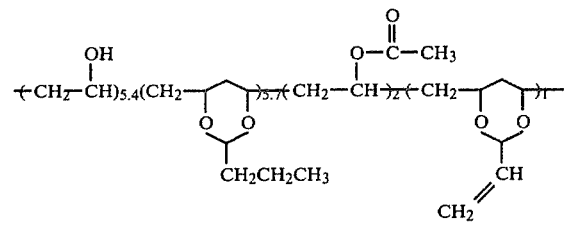

This material is hereinafter referred to as P-V.

PREPARATIONS VI-XI

Six additional oligomers were prepared for evaluation in the present invention.

P-VI was prepared by first placing 128.8 g of 2,4-toluenediisocyanate into a three neck, 250 ml flask equipped with a mechanical stirrer and a pressure equalizing dropping funnel. The flask was maintained at room temperature with a water bath. Hydroxyethylmethacrylate (106.6 g) and 0.089 butylated hydroxy toluene and 100 g methylethyl ketone were added slowly over a 30 minute period. The reaction was stirred for one hour at room temperature. Methylethyl ketone was added and the reaction mixture was heated to 45° C. for 3 hours to complete the reaction.

P-I (350 g of 79% solids in methylethyl ketone) was placed into a 500 ml, three neck flask equipped with a mechanical stirrer, pressure equalizing dropping funnel and 26.0 g 2,4-toluenediisocyanate was added over a 30 minute period. The temperature rose to 32° C. The mixture was cooled to room temperature and stirred over the weekend. The first reaction product from the above synthesis was added over a four hour period to this second solution which had been heated to 65° C.

Heating was continued for ten hours to form the second reaction product.

1.8 g of succinic anhydride and 0.1 g lithium acetate were added to 112.4 g (71% solids in methylethyl ketone) of the second reaction product and the entire mixture heated to 78° C. for twelve hours to complete the reaction and form oligomer P-VI.

P-VII was prepared by placing 112.4 g (71% solids in methylethyl ketone) of the second reaction product in the preparation of P-VI into a 500 ml three neck flask with stirrer and condenser and then adding 2.4 g succinic anhydride and 0.1 g lithium acetate. The mixture was heated to 78° C. for 12 hours until the reaction was complete to form P-VII.

P-VIII was formed by placing 112.4 g (71% solids in methylethyl ketone) of the second reaction product in the preparation of P-VI into a 500 ml three neck flask with stirrer and condenser with 5.5 g siccinic anhydride and 0.1 g lithium acetate. The reaction mixture was then heated to 78° C. for 32 hours until the reaction was complete to form P-VIII.

P-IX was formed by first preparing a polycaprolactone hexol by introducing 342 g caprolactone and 127 g dipentaerythritol into a 1000 ml reaction kettle equipped with a thermometer, mechanical stirrer and condenser. The reaction mixture was deoxygenated by bubblinb dry nitrogen through a gas dispersion tube for about 30 minutes. The gas dispersion tube was then replaced with a gas inlet adapter and the reaction was maintained under a slight positive nitrogen pressure. The reaction mixture was heated in an oil bath at 165°-170° C. with continuous stirring for 24 hours. The product was allowed to cool to room temperature while under a nitrogen atmosphere.

141.0 g of the polycaprolactone hexol and 50 g of methylethyl ketone were placed in a 1000 ml flask equipped with a pressure equalizing dropping funnel and a mechanical stirrer. This solution was maintained at room temperature by using a water bath while 2,4-toluene diisocyanate (13.0 g) in 20 g of methylethyl ketone was added over a 25 minute period through the dropping funnel with continuous stirring. Stirring at room temperature was continued for 22 hours to form the second reaction product.

38.2 g of 2,4-toluene diisocyanate and 0.2 butylated hydroxytoluene were introduced into a 250 ml three neck flask equipped with mechanical stirrer, pressure equalizing dropping funnel and thermometer. Hydroxymethyl methacrylate (31.2 g) was added with continuous stirring over fifteen minutes at a temperature below 30° C. The mixture was stirred for one hour and a white solid formed. 20 ml of methylethyl ketone was added and the mixture heated to 45° C. for three hours to complete formation of the third reaction product.

69.7 g of the second reaction product and 0.02 g butylated hydroxy toluene were added to a 500 ml three neck flask with a mechanical stirrer, condenser, and pressure equalizing dropping funnel. This solution was heated to 69° C. with continuous stirring. The entire portion of the third reaction product was added to this solution over one hour. Heating and stirring were continued for thirteen hours to form the fourth reaction product.

13.0 g of succinic anhydride and 0.4 g of lithium acetate were added to the fourth reaction product and the solution heated at 70° C. to 80° C. with continuous stirring to form P-IX.

P-X was prepared by first forming a polyol by placing 93.1 g tripentaerythritol and 303.2 g caprolactone in a 1 liter reaction kettle equipped with mechanical stirrer, condenser, and thermometer. The reaction mixture was purged with dry nitrogen for 30 minutes, and a gas inlet tube affixed thereto. Positive nitrogen pressure was maintained over the reaction mixture as it was heated to 165°-170° C. for 9½ hours, then allowed to cool to room temperature.

300 g of this polyol and 75 g of methylethyl ketone were introduced into a 1000 ml flask equipped with stirrer, dropping funnel and thermometer, 16.4 g of 2,4-toluene diisocyanate was added through the dropping funnel over 10 minutes. The temperature of the mixture rose to between 28°-32° C. and continued for about 3½ hours to form the first reaction product. 153 g of this product (as 80% solids in methylethyl ketone) was added with 0.04 g butylated hydroxytoluene into a flask and heated to 65°-70° C. Over a period of 2 hours the third reaction product of preparation IX was added to this solution and heated for an additional three hours.

18.5 g of succinic anhydride and 0.5 g of lithium acetate was added to the above resulting solution and the mixture heated at 70°-80° C. for 22 hours to product P-X.

P-XI was prepared by first forming an adduct of 2,4-toluene diisocyanate (26.8 g) and hydroxyethylmethacrylate (22 g) in 30 ml of methylethyl ketone with 0.02 g butylated hydroxytoluene in the same procedure used in forming the third reaction product of preparation IX. This product was added over a one hour period to the product of the second solution of P-VI (87.7 g as 80% solids in methylethyl ketone) and 0.02 g butylated hydroxytoluene and heated to 65°-70° C. Heating was continued for 7½ hours at about 67° C.

19.6 g of succinic anhydride and 0.4 g lithium acetate were then added to the solution and heated at 75° C. for 84 hours to form P-XI.

PREPARATION XII

A urethane oligomer (hereinafter P-XII) was prepared according to the following procedure.

A 1000 ml three neck flask with adapter fitted with an overhead mechanical stirrer, thermometer, addition funnel and drying tube was charged with 180 g of a polypropylene oxide polyol of molecular weight 600 and 90 ml of methylethyl ketone. A solution of 34.8 g 2,4-toluene diisocyanate in 30 g of methylethyl ketone was added with stirring at room temperature. The addition was completed after 80 minutes and stirring was continued at room temperature for 90 minutes. After the addition of 0.02 g 2,6-di-t-butyl-4-methyl phenol, the temperature was increased to 45°-55° C. for about 15 hours at which time isocyanate groups were no longer detected by infrared analysis.

To a 250 ml one neck flask with a magnetic stirrer and drying tube was charged 95.7 g 2,4-toluene diisocyanate. 78 g of 2-hydroxyethylmethacrylate was added over a period of about 10 minutes while maintaining the temperature at less than 30° C. with a cold water bath. After about 40 minutes of total reaction time a white solid formed and 45 ml of methylethyl ketone was added. The solution solidified on standing overnight and was redissolved by warming to about 45° C.

The product from the reaction of polyol and 2,4-toluene diisocyanate was heated to 67° C. and the product from the 2-hydroxyethylmethacrylate and 2,4-toluene diisocyanate was added over a period of about 30 minutes. After 6 hours 27 g of succinic anhydride and 1.05 g of lithium acetate were added. After about 28 hours of heating at 53° C. to 70° C. the anhydride was determined to be completely reacted by infrared analysis.

EXAMPLES 1–4

A solution was prepared (in parts by weight) from 3.32 parts pentaerythritol tetraacrylate, 1.87 parts P-II, 0.17 parts triethylamine, 0.34 parts of diphenyliodonium hexafluorophosphate, 0.17 parts 4,4'-bis(dimethylamino)benzophenone (a photosensitizer for the iodonium catalyst) and 91.62 parts of n-propanol/water azeotrope (71.8% n-propanol and 28.2% water). Aliquots of this solution were prepared and 2.50 parts by weight of different organic polymeric binders were added to the solution.

Aluminum sheets which had been grained and anodized were coated with these solutions using a #14 wire wound rod and then dried with a heat gun. The coated aluminum was then exposed for 13 seconds in a vacuum frame to a carbon arc having about a 5000 watt output and at about 1 meter distance through a 21 step sensitivity guide and a neutral density 0.51 filter. Exposed plates were developed by wiping with a weak basic aqueous solution of 0.63% sodium metasilicate and 0.23% sodium (lower alkyl) naphthalene sulfonate.

The binders used in the examples were:
1. P-V,
2. Poly(vinyl methyl ether),
3. Poly(vinyl formal), prepared from a polyvinyl acetate starting material and having 85% of the acetate groups replaced by alcohol and formal groups (the polyvinyl acetate having a viscosity of about 12 cp at 25° C. as 86 grams in 1000 ml of benzene), and
4. Poly(vinyl butyral).

The following table shows the polymer retained after exposure to a certain number of steps and development by the weak basic solution.

| Example | Steps | |
|---------|-------|-------|
|         | Solid | Ghost |
| 1 | 8 | 10 |
| 2 | 4 | 6 |
| 3 | 4 | 5 |
| 4 | 2 | 4 |

The "ghost" values indicate the lowest exposure from which photopolymer was retained on the plate. The "solid" values indicate the exposure level at which the developed image density can no longer be differentiated from the background and is believed to be cured to the desired level.

The numbers of the steps consecutively indicate an increase of about 40% in filtering strength. The higher the step number remaining after development, the correspondingly higher sensitivity of the composition exposed and developed.

EXAMPLE 5

The usefulness of the compositions of the present invention in conventional newspaper printing operations was evaluated here.

A solution was prepared having 17.2 grams pentaerythritol tetraacrylate, 13.5 grams P-II (70% by weight in methylethyl ketone), 171.6 grams of polyvinyl formal in a 6% by weight solution in the azeotrope, 295 grams of the n-propanol/water azeotrope, 4.3 grams of 20% triethylamine, 3.7 grams of red pigment (Pigment Red 48, CI15865 in the Color Index) in a composition of 1:2 weight ratio to polyvinyl formal (as described above), 1.74 grams diphenyliodonium hexafluorophosphate and 0.65 grams 4,4'-bis(dimethylamino)benzophenone photosensitizer. This composition was coated on grained anodized aluminum using a squeeze roll coater fitted with a rubber gravure sleeve. The coating weight was about 1.72 grams/m$^2$. The coating was exposed in a vacuum frame by a carbon arc for 40 seconds through a neutral density 0.5 filter and a newspaper negative. The coating was developed with the aqueous developing solution of Examples 1–4 and then gummed with a standard substractive plate gum. The resulting printing plate was mounted on a high speed web press using direct lithographic techniques and produced 95,000 newspaper impressions without degradation of the image line copy or half-tones.

EXAMPLE 6

A solution was prepared from 7.72 grams of P-V, 327.4 grams of the n-propanol/water azeotrope, 12.8 grams of pentaerythritol tetraacrylate, 10.3 grams of a 69% by weight solution of P-II in the azeotrope, 3.2 grams of a 20% solution of triethylamine in the azeotrope, 15.7 grams of Pigment Red 48 dispersed in P-V and the azeotrope (4:8:88), 1.3 grams of diphenyliodonium hexafluorophosphate and 0.65 grams of the benzophenone sensitizer of the previous examples. This solution was coated onto grained anodized aluminum using a squeeze roll coater fitted with a rubber gravure sleeve at a coating weight of about 1.72 grams/m$^2$. The coatings were exposed from a pasteup with a laser imaging system, using primarily the 351 and 364 nm lines of an argon ion laser, (at 4 milliJoules/cm$^2$ exposure) and developed with the mild basic aqueous developing solution of the previous examples, and gummed with a commercial substractive plate gum. The printing plates were mounted on a web offset press and produced high quality impressions.

EXAMPLE 7

A solution was prepared from 12.8 grams of polyvinyl formal from a 6% by weight solution in the n-propanol/water azeotrope, 1.28 grams of pentaerythritol tetraacrylate, 1.42 grams of P-III as a 50% by weight solution in ethyl acetate, 24 grams of the azeotropic solution, 0.28 grams of Pigment Red 48 in polyvinyl formal (1:2 weight ratio), 8 drops of a 20% solution of triethylamine in the azeotrope, 0.13 grams of diphenyliodonium hexafluorophosphate and 0.065 grams of the benzophenone sensitizer of the previous examples.

This solution was coated onto grained anodized aluminum using a #14 wire wound rod. After exposure (from a 5000 watt output carbon arc for 13 second through neutral density 0.51 filter) and development with the weak basic solution of the previous examples, a solid image at step 6 was obtained, and a ghost image at step 7 was obtained.

EXAMPLE 8

A solution was prepared from 1.54 grams of P-V, 2.56 grams of pentaerythritol tetraacrylate, 2.06 grams of P-II as a 70% by weight solution in methylethyl ketone, 0.64 grams of triethylamine as a 20% by weight solution in the azeotrope, 4.7 grams of a dispersion of Pigment Red 48 in P-V and the azeotrope (4:8:88), 65.6 grams of the azeotrope, 0.25 grams of diphenyliodonium hexafluorophosphate, and 0.13 grams of 4,4'-bis(dimethylamino)benzophenone. This solution was coated with a #14 wire wound rod onto a substrate comprising polyethylene film with a top coat of $TiO_2$ and $CaCO_3$ in a polyurethane binder. This coating was air dried with a heat gun and overcoated with a 10% solution of low molecular weight (88% hydrolyzed polyvinyl acetate) poly(vinyl alcohol) with a small amount of inert surfactant as a coating aid. A #10 wire wound rod was used to coat this solution. The dried coating was exposed in a vacuum frame to a carbon arc for 13 seconds through a 0.5 neutral density filter, a half-tone negative, and a sensitivity guide. The exposed coating was developed with an aqueous solution of 0.63% sodium metasilicate and 0.23% sodium (lower alkyl)naphthalene sulfonate. A strong magenta image on a white background was obtained. Solid 3 and ghost 5 steps were visible and sharp 3–97% dots of at least a 110 line screen were obtained.

EXAMPLES 9–15

The following examples show the necessity and interaction of the different components of the system of the present invention. The effect of poly(vinyl alcohol) topcoats, normally used in the art as an oxygen barrier, was also investigated.

Solutions were prepared with different combinations of representative additives. P-V was used as the binder, P-II as the carboxyl containing free radical polymerizable oligomer, pentaerythritol tetraacrylate as the free radical polymerizable monomer, diphenyliodonium hexafluorophosphate (as 0.04 parts by weight) as the free radical initiator,

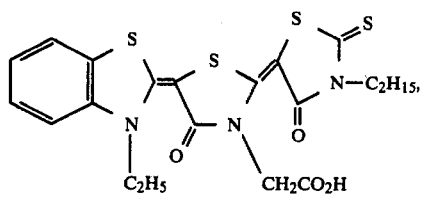

hereinafter referred to as CEBH (0.01 parts by weight) as sensitizer, and poly(vinyl alcohol) as a topcoat. The solutions having the compositions noted below in the table were coated on grained and anodized aluminum to give dry coating weights of from 1.06 to 1.61 grams/m². Where a topcoat was present, the poly(vinyl alcohol) was applied at about the same coating weight as the base coat. In the examples the solutions were made from isopropanol or methanol-methylethyl ketone-water solvents. Triethylamine was added in all examples in amounts equivalent to the acid in P-II.

The dried samples were exposed through a 21 step sensitivity guide for 2 seconds with a 16,000 foot candle tungsten source. The exposed samples were developed by wiping with an aqueous solution of 0.35% sodium metasilicate and 0.25% sodium (lower alkyl)naphthalene sulfonate.

| Example No. | P-V | P-II | Monomer | Top Coat | Steps |
| --- | --- | --- | --- | --- | --- |
| 9 | 0.3 | 0.0 | 0.4 | No | 1 |
| 10 | 0.3 | 0.4 | 0.0 | No | 1 |
| 11 | 0.0 | 0.5 | 0.4 | No | 0 |
| 12 | 0.0 | 0.5 | 0.4 | Yes | 10 |

-continued

| Example No. | P-V | P-II | Monomer | Top Coat | Steps |
| --- | --- | --- | --- | --- | --- |
| 13 | 0.3 | 0.2 | 0.4 | No | 9 |
| 14 | 0.3 | 0.4 | 0.2 | No | 10-11 |
| 15 | 0.3 | 0.4 | 0.2 | Yes | 14 |

As can be seen from these results, the absence of any one of the three ingredients (binder, oligomer, or monomer) produces poor or useless photopolymerizable compositions. When a top coat is put on the composition without the binder (Example 12), the oxygen sensitivity of the system is reduced and it polymerizes well. Surprisingly, systems having the three components of the present invention work as well as the top coated system (Examples 13 and 14), and when the systems of the present invention are combined with a top coat, even further improved results are obtained (Example 15). These results are surprising and highly desirable.

EXAMPLE 16

A solution was prepared from 4 parts poly(m-diallylphthalate), 2 parts P-II, 4 parts pentaerythritol tetraacrylate, 5 parts methanol, 0.4 parts diphenyliodonium hexafluorophosphate, 0.1 part CEBH, 0.4 parts of Phthalocyanine Blue GS, and methylethyl ketone in 100 parts. This was coated onto grained and anodized aluminum to give a dry coating weight of about 1.34 grams/m². This was overcoated with poly(vinyl alcohol) at about the same coating weight as the base coat. The coating was air dried, then exposed and developed as in Examples 9–15.

The photopolymer was retained through step 12.

EXAMPLE 17

The same procedure as in Example 16 was used except that 4 parts of tris-methacryloxyethyl isocyanurate was substituted for the pentaerythritol tetraacrylate. The photopolymer was again retained through step 12.

EXAMPLES 18–21

A solution was prepared from 0.3 grams P-V, 0.4 grams pentaerythritol tetraacrylate, 0.22 grams P-II, 0.04 grams diphenyliodonium hexafluorophosphate, 0.02 grams of CEBH, 1.28 grams methylethyl ketone, 0.47 grams water, 7.36 grams isopropanol, and 6 drops of a 20% by weight solution of triethylamine in n-propanol. The solution was coated with wire wound rods onto grained and anodized aluminum at coating weights of 0.95, 1.36 and 2.04 grams/m². Some of the coatings were overcoated with a 10% by weight solution of poly(vinyl alcohol) using a #8 wire wound rod. The coatings were exposed using an argon laser at 488 nm and developed by wiping with a pad and an aqueous solution of a 0.35% sodium metasilicate and 0.25% sodium (lower alkyl)naphthalene sulfonate. The laser beam was passed through a 21 step sensitivity guide. The exposure values (in milliJoules/cm²) listed are the exposures needed to give a solid step 6 for the various coating weights.

| Example | Coating Weight g/m² | Top Coat | Exposure |
| --- | --- | --- | --- |
| 18 | .95 | Yes | 1.8 |
| 19 | 1.36 | Yes | 1.8 |
| 20 | 1.36 | No | 10-14 |
| 21 | 2.04 | No | 10 |

As can be seen, the top coat improves the compositions, but the uncoated materials are still of excellent speed and quality even when exposed in the presence of air.

EXAMPLES 22-32

Solutions were prepared as in Example 16 except that different photoinitiation systems were evaluated. Exposure was to a mercury vapor lamp having an output of 500 watts/inch at a distance of about 34 cm through an interference filter having a maximum transmission at 366 nm and a 21 step sensitivity guide. The table indicates the relative sensitivity of the system for the minimum exposure required to give retained photopolymer with development as in Example 16.

| Ex. | Photoinitiation System | Approx. Absorption at 366 nm | Relative Exposure |
|---|---|---|---|
| 22 | 4,4'-bis(dimethylamino)benzophenone 2-o-chlorophenyl-4,5-di(m-methoxyphenyl)imidazole dimer 2-o-chlorophenyl-4,5-diphenylimidazole dimer 2-mercaptobenzoxazole | 0.3 | 0.26 |
| 23 | Same as Example 22 | 0.01 | 0.88 |
| 24 | 4,4'-bis(dimethylamino)benzophenone diphenyliodonium hexafluorophosphate | 0.1 | 2.2 |
| 25 | tetraphenyl benzidine diphenyliodonium hexafluorophosphate | 0.2 | 3.3 |
| 26 | tetraphenyl benzidine diphenyliodonium hexafluorophosphate | 0.1 | 4.8 |
| 27 | tetraphenyl benzidine diphenyliodonium hexafluorophosphate | 0.02 | 13 |
| 28 | 2,4-bis(trichloromethyl)-6-(4-methoxystyryl)-s-triazine | 0.2 | 6.6 |
| 29 | 3-carboxymethyl-5(3-ethyl-2-benzothiazolinylidene)-2-(3-heptyl-4-oxo-2-thio-5-thiazolinylidene)-4-thiazolidone diphenyliodonium hexafluorophosphate | 0.02 | 13 |
| 30 | chlorothioxanthone diphenyliodonium hexafluorophosphate | 0.2 | 9 |
| 31 | ethyldimethoxy anthracene diphenyliodonium hexafluorophosphate | 0.02 | 40 |
| 32 | 4,4'-bis(dimethylamino)-benzophenone | 0.1 | 40 |

EXAMPLES 33-39

A stock solution was prepared by mixing 5.13 grams pentaerythritol tetraacrylate, 4.03 grams P-II, 25.5 grams of a 10% by weight solution of polyvinyl formal in the azeotropic solution of n-propanol and water, 119 grams of methylethyl ketone and 1.5 grams of a 20% by weight solution of triethylamide in the azeotrope. To aliquots of 20 grams of this solution were added various photoinitiation systems. The photoinitiation systems and amount of each are shown in the following table. The solutions were then coated on a grained anodized aluminum substrate with a #14 wire wound rod and dried with a heat gun. The resulting coatings were exposed for 13 seconds to a carbon arc through a 21 step sensitivity guide and a 0.5 density filter. The exposed coatings were developed by wiping with an aqueous solution of 0.63% by weight sodium metasilicate and 0.23% by weight of sodium (lower alkyl)naphthalene sulfonate. The number of solid steps observed after gumming and inking were recorded. As in previous examples, the higher the number of steps retained, the greater the sensitivity of the coating.

| Ex. | Photoinitiation System | Weight (Grams) | Solid Steps |
|---|---|---|---|
| 33 | 4,4'-bis(dimethylamino)benzophenone | 0.035 | 0 |
| 34 | 4,4'-bis(dimethylamino)benzophenone diphenyliodonium hexafluorophosphate | 0.035 0.070 | 7 |
| 35 | 7-diethylamino-4-methylcoumarin | 0.035 | 0 |
| 36 | 7-diethylamino-4-methylcoumarin diphenyliodonium hexafluorophosphate | 0.035 0.070 | 4 |
| 37 | 2,4-bis(trichloromethyl)-6-(4-methoxystyryl)-s-triazine | 0.070 | 2 |
| 38 | 2,4-bis(trichloromethyl)-6-(4-methoxystyryl)-s-triazine | 0.14 | 3 |
| 39 | 4,4'-bis(dimethylamino)benzophenone 2-o-chlorophenyl-4,5-di(m-methoxy phenyl)-imidizole dimer 2-o-chlorophenyl-4,5-diphenyl imidizole dimer 2-mercaptobenzoxazole | 0.035 0.10 0.10 0.07 | 11 |

None of these compositions had top coats.

EXAMPLES 40 AND 41

Two additional monomers were evaluated in the compositions of the present invention. Two solutions (A and B) were prepared having the following composition:

|  | Grams |
|---|---|
| P-II (64% in methylethyl ketone | 3.12 |
| polyvinylformal (10% in the n-propanol-water azeotrope) | 7.6 |
| P-V (12.9% in n-propanol (62%), isopropanol (10%), and water (28%)) | 4.18 |
| dispersion of Pigment Red 48 and polyvinyl formal (10% in the above azeotrope) in a 2/1 parts by weight ratio resin/pigment | 10.0 |
| 4,4'-bis(dimethylamino)benzophenone | 0.19 |
| diphenyliodonium hexafluorophosphate | 0.37 |
| triethylamine (20% by weight in the azeotrope) | 0.96 |
| n-propanol-water azeotrope | 70.0 |

To solution A was added 3.67 grams of pentaerylthritol tetraacrylate and to solution B was added 3.67 grams of tris(2-acryloxyethyl) isocyanurate). The solutions were then coated onto grained and anodized aluminum using a number 18 wire wound rod and dried for one minute at 65° C. The coated plates were then exposed with a 2 kilowatt diazotype lamp for 2, 5, and 10 seconds in air. The exposed plates were developed by washing with an aqueous solution of 3% sodium metasilicate, 3% n-propanol, 0.3% sodium dodecyl diphenylether disulfonate, and 0.3% of an alkyl naphthalene sulfonate. The number of solid and ghost steps remaining after development are given in the following table.

| Coating | 2 Sec. Solid/Ghost | 5 Sec. Solid/Ghost | 10 Sec. Solid/Ghost |
|---|---|---|---|
| A | 4–5 | 5–7 | 6–8 |
| B | 7–8 | 9–10 | 9–11 |

EXAMPLES 42 AND 43

The usefulness of the compositions of the present invention with lower intensity exposure processes was examined. The compositions as weight percentages were as follows:

| Component | Percentage Solids Solution A | Percentage Solids Solution B |
|---|---|---|
| pentaerythritol tetraacrylate | 43.1 | 32.3 |
| P-II | 23.7 | 18 |
| P-V | 6.25 | 17.2 |
| polyvinyl formal (10% in the azeotrope) | 15.2 | 17.7 |
| pigment dispersion (of Example 40) | 3.09 | 2.8 |
| triethylamine (20% in the azeotrope) | 2.15 | 1.6 |
| diphenyliodonium hexafluorophosphate | 4.30 | 8 |
| 4,4'-bis(dimethylamino)benzophenone | 2.14 | 2 |

Solution A was dried for one minute at 180° F. with a coating weight of 200 mg/ft². Solution B was dried with a heat gun at a coating weight of 170 mg/ft². The substrate in both cases was grained and anodized aluminum. A conventional microfilm enlarger was used and the plates were exposed with between 10 and 30 milliwatts/cm² irradiance by a mercury xenon lamp through a 21 step sensitivity guide in contact with the plate. Exposure was made in air. The exposed plates were developed by washing with an aqueous solution of 5.25% metasilicate, 6.37% n-propanol, 8.25% glycerol and 0.075% alkyl naphthalene sulfonate. The results are reported below.

| Plate | Exposure Time Seconds | Steps Solid/Ghost |
|---|---|---|
| A | 2 | 3–5 |
| | 4 | 4–6 |
| | 6 | 5–6 |
| | 8 | 5–7 |
| B | 2 | 5–7 |
| | 4 | 6–8 |
| | 6 | 6–8 |

When identical plates were imaged (A for 3 seconds and B for 1 second) with line copy and half tones on an aluminum sheet, 10,000 high quality impressions were obtained with no image loss.

EXAMPLES 44–50

A standard solution was prepared having the following weight percentages of ingredients in the n-propanol-water azeotrope:

| | | |
|---|---|---|
| pentaerythritol tetraacrylate | 43.2 | |
| P-V | 6.35 | |
| polyvinyl formal (10% in the azeotrope) | 15.1 | |
| Pigment Red 48 | 3.1 | |
| triethylamine | 2.15 | |
| diphenyliodonium hexafluorophosphate | 4.4 | |
| 4,4'-bis(dimethylamino)benzophenone | 2.2 | |

To seven aliquots of this solution were added 23.5 percent by weight of the oligomers P-II and P-VI through P-XI. The solutions were coated on grained and anodized aluminum using a number 18 wire wound rod and dried for one minute at 65° C. The dry coatings were exposed in air through a 21 step sensitivity guide with a mercury metal halide diazo bulb and developed by wiping with the aqueous developing solution of Example 40. The results are shown in the following table.

| Example | Oligomer | Steps Solid/Ghost |
|---|---|---|
| 44 | P-VI | 4–7 |
| 45 | P-VII | 4–7 |
| 46 | P-VIII | 3–6 |
| 47 | P-IX | 4–5 |
| 48 | P-II | 3–6 |
| 49 | P-X | 4–5 |
| 50 | P-XI | 0–2 |

The above examples show the effect of varying the ratio of acid groups to molecular weight of the oligomer. The first two compositions (Examples 44 and 45) had ratios of acid groups to molecular weight of approximately 1:4300 and 1:3600 respectively and were more difficult to develop than preferred and had a tendency to hold the ink on the background. A stronger or more vigorous developer could correct that tendency. The oligomer of Example 50 had an acid to molecular weight ratio of about 1:750 and developed a little too easily, with much of the photoreacted material being removed. All compositions were useful and could be polymerized in air, however. Examples 46 through 49 worked exceptionally well and had a ratio of the number of acid groups to molecular weight of between about 1:800 and 1:3000, with Example 48 having a ratio of about 1:1200. Compositions without any acid groups do not adhere well to the substrate. Development does not differentiate between exposed and unexposed areas with both being removed indiscriminately. Compositions without ethylenic unsaturation do not photoreact and also do not bind to the plate surface.

EXAMPLE 51

A solution was prepared like those in Examples 44–50 using P-XII in place of the oligomers in the above examples. Coatings were exposed and developed as in Examples 44–50. Only one ghost step and no solid steps were obtained. Prolonged exposure gave more retained steps.

EXAMPLES 52–57

A solution was prepared for the comparison of different binder materials. The solution comprised in parts by weight:

| | | |
|---|---|---|
| pentaerythritol tetraacrylate | 41.3 | |
| P-II | 22.5 | |
| polyvinyl formal | 9.95 | |
| Pigment Red 48 | 2.94 | |
| triethylamine | 2.05 | |
| diphenyliodonium hexafluorophosphate | 4.2 | |
| 4,4'-bis(dimethylamino)benzophenone | 2.1 | |

-continued

| | selected binders | 14.9 |
|---|---|---|

The binders selected were

| 52. | P-V |
|---|---|
| 53. | low molecular weight hydroxypropyl cellulose |
| 54. | polyvinyl butyral (MW 38,000–45,000) |
| 55. | polyamide (Elvamide$^R$ nylong resin supplied by DuPont Co.) |
| 56. | polyvinyl formal |
| 57. | no resin |

The solutions were coated onto salt plates (clear crystals of sodium chloride), dried, and the infrared spectrum determined. The coatings were exposed in air to radiation from a 2 kilowatt mercury metal halide diazo bulb for various times at various irradiances. The infrared spectrum was determined after the exposure and the percentage of double bonds converted by the exposure was calculated on the basis of the absorption at 810 cm$^{-1}$. The results appear below.

| Example | Percentage of Double Bonds Converted at 9 mW/cm$^2$ Irradiance |
|---|---|
| 52 | 35 |
| 53 | 32 |
| 54 | 32 |
| 55 | 27 |
| 56 | 25 |
| 57 | 15 |

EXAMPLES 58–69

A solution was prepared for the comparison of different binder materials. The solution comprised in parts by weight:

| pentaerythritol tetraacrylate | 43.1 |
|---|---|
| P-II | 23.7 |
| polyvinyl formal | 15.0 |
| Pigment Red 48 | 3.0 |
| triethylamine | 2.2 |
| diphenyliodonium hexafluorophosphate | 4.4 |
| 4,4'-bis(dimethylamino)benzophenone | 2.2 |
| selected polymeric binders | 6.3 |

The binders selected were

| 58. | P-V |
|---|---|
| 59. | polyvinylpyrolidone |
| 60. | polyvinyl formal |
| 61. | copolymer of vinyl chloride (81%) and vinyl acetate (19%) |
| 62. | polyvinyl acetate |
| 63. | polyethylene oxide (MW ≅ 4,000,000) |
| 64. | polymethylmethacrylate (low molecular weight, inherent viscosity ≅ 0.2) |
| 65. | low molecular weight polyolefin resin |
| 66. | linear saturated polyester resin |
| 67. | thermoplastic aromatic polyurethane |
| 68. | cellulose acetate butyrate |
| 69. | no resin. |

The results of infrared analysis after coating of these compositions as in Examples 52–57 and exposure to 9 milliWatts/cm$^2$ irradiance appears below.

| Example | Double Bond Conversion % |
|---|---|
| 58 | 30 |
| 59 | 30 |
| 60 | 25 |
| 61 | 25 |
| 62 | 25 |
| 63 | 24 |
| 64 | 23 |
| 65 | 16 |
| 66 | 15 |
| 67 | 15 |
| 68 | 13 |
| 69 | 15 |

In examples 52–69, exposure time was 10 seconds.

What is claimed is:

1. A polymerizable oligomer of the formula $$(E-D)_a-R+OC-A)_b$$
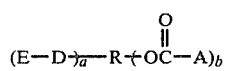

wherein
E is an ethylenically unsaturated, free radical polymerizable group,
D is the residue of a polyisocyanate having at least two of its isocyanate groups reacted to form $$-NHC- \text{ groups}$$
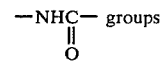

bonded to E and R,
R is the residue of a polyol having at least a+b hydroxyl groups, the residue formed by removal of hydrogen from the hydroxyl groups, said polyol having a number average molecular weight between 90 and 10,000,
A is a carboxylic acid containing group,
a is a number having an average value between 2 and 20, and
b is a number having an average value between 0.3 and 10.

2. The oligomer of claim 1 wherein
E is selected from the class consisting of acryloyloxyalkoxy, methacryloyloxyalkoxy, vinylalkoxy, and allyloxy groups,
D is the residue of a diisocyanate,
A is selected from the group consisting of $$+CH_2)_mCOH \text{ and } -C_6H_4COH, \text{ and}$$
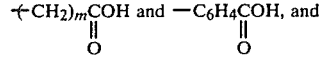

m is an integer of from 1 to 6 inclusive.

3. The oligomer of claim 2 wherein
E is selected from the class consisting of acryloyloxyalkoxy and methacryloyloxyalkoxy, and
said oligomer has 2 to 4 ethylenically unsaturated groups selected from the class consisting of acryloxy and methacryloxy.

4. The oligomer of claim 3 wherein
R is the residue of a polyesterpolyol having a hydroxy equivalent weight between 90 and 4,000.

5. The oligomer of claim 1 wherein said oligomer is represented by the formula:

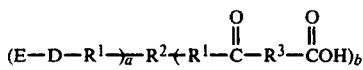

wherein
- E is an ethylenically unsaturated free radical polymerizable group selected from acryloyloxyalkoxy and methacryloyloxyalkoxy,
- D is the residue of a diisocyanate having its two isocyanate groups reacted to form

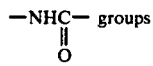 groups bonded to E and $R^1$,
- $R^1$ is the residue formed by the removal of active hydrogen atoms and hydroxyl groups from oligomeric Ω-hydroxy carboxylic acids or the residue formed by the removal of active hydrogen atoms and hydroxyl groups from oligomeric diols,
- $R^2$ is the residue of an aliphatic polyol having the formula $R^5(OH)_{a+b}$ after removal of $a+b$ hydrogens from hydroxyl groups and having a valence of $a+b$, or the residue of an aliphatic polyol having the formula $$(HO)_{\frac{a+b-1}{2}} R^5-O-D-O-R^5(OH)_{\frac{a+b-1}{2}}$$

after removal of $(a+b-1)$ hydrogens from hydroxyl groups and $R^5$ is the residue of an aliphatic polyol radical formed by having the OH groups of the polyol removed therefrom and having 3 to 10 valences substituted with OH groups,
- $R^3$ is the residue formed by removal of two

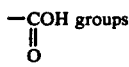 groups from a dicarboxylic acid,
- a is a number having an average value of from 2 to 20, and
- b is a number having an average value of from 0.3 to 10, wherein the molecular weight of $(R^1)_{\overline{a}}R^2(R^1)_b$ is between 200 and 5,000.

6. The oligomer of claim 1 wherein said oligomer is represented by the formula:

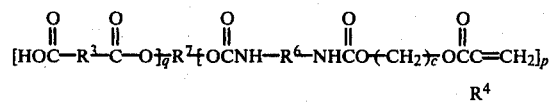

wherein
- $R^3$ is the residue formed by the removal of two

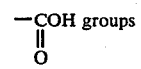 groups from a dicarboxylic acid,
- $R^4$ is H or $CH_3$,
- c is 2 to 5 inclusive,
- p is a number average value of from 2 to 7.7,
- q is a number average value of from 0.3 to 4,
- $R^6$ is the residue formed by the removal of two isocyanate groups from a diisocyanate, and
- $R^7$ is an organic polyol radical which is the residue of an organic polyol with at least three hydroxyl groups removed therefrom and having a molecular weight of from 90 to 10,000.

7. The oligomer of claim 1, wherein said oligomer is of the formula

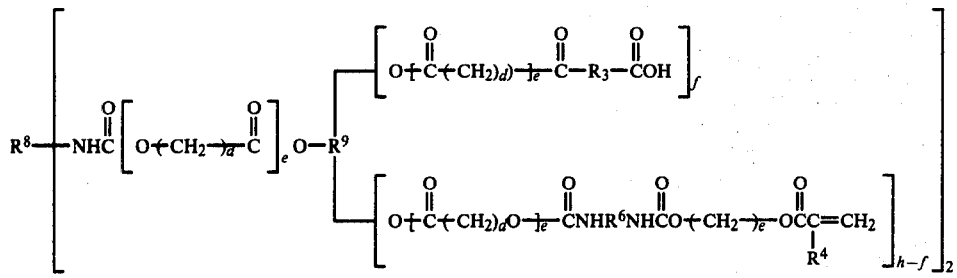

wherein
- $R^3$ is the residue formed by removal of two

 groups from a dicarboxylic acid,
- $R^4$ is H of $CH_3$,
- $R^6$ and $R^8$ are independently the residues formed by the removal of two isocyanate groups from a diisocyanate,
- di is 1 to 6 inclusive,
- e if an average value of 0.5 to 5 inclusive
- $R^9$ is an alkanepolyol radical having a valence of $h+1$ that is the residue of an alkanepolyol having $h+1$ hydroxyl groups removed therefrom, said alkanepolyol having a molecular weight of from 100 to 10,000,
- f is an integer of 1 to 6, and
- h is an integer of 2 to 8.

* * * * *